United States Patent [19]

Schink

[11] 4,301,323
[45] Nov. 17, 1981

[54] LEAD-DOPED SILICON WITH ENHANCED SEMICONDUCTOR PROPERTIES

[75] Inventor: Norbert Schink, München, Fed. Rep. of Germany

[73] Assignee: Siemens Aktiengesellschaft, Berlin and München, Fed. Rep. of Germany

[21] Appl. No.: 152,046

[22] Filed: May 21, 1980

[30] Foreign Application Priority Data

May 30, 1979 [DE] Fed. Rep. of Germany ....... 2922055
May 30, 1979 [DE] Fed. Rep. of Germany ....... 2922063

[51] Int. Cl.³ .................... H01L 31/00; H01L 31/04; H01L 31/18
[52] U.S. Cl. .................... 136/261; 136/258; 156/605; 156/620; 156/DIG. 64; 148/174; 148/186; 148/189; 148/183; 357/30; 357/63; 423/349; 427/86
[58] Field of Search .......................... 136/258, 261; 252/62.3 E; 423/349; 156/605, 620, DIG. 64, DIG. 85; 148/186, 189, 174, 182; 357/30, 63; 427/86

[56] References Cited

U.S. PATENT DOCUMENTS 3,390,020  6/1968  Mandelkorn .......................... 148/1.5
3,409,554  11/1968  Mandelkorn ...................... 252/62.3 E
3,836,999  9/1974  Nishizawa ............................. 357/63
4,249,957  2/1981  Koliwad et al. ..................... 136/258

OTHER PUBLICATIONS

D. E. Hill et al., "The Effect of Secondary Impurities on Solar Cell Performance", *Conf. Record*, 12th IEEE Photovoltaic Specialists Conf., (1967), pp. 112-119.

*Primary Examiner*—Aaron Weisstuch
*Attorney, Agent, or Firm*—Herbert L. Lerner; Laurence A. Greenberg

[57] ABSTRACT

Silicon having semiconductor properties, adapted for use as an optoelectronic component, in particular solar cells, has its optoelectronic properties improved by adding to the silicon an agent, preferably lead, which increases the carrier life time.

31 Claims, No Drawings

LEAD-DOPED SILICON WITH ENHANCED SEMICONDUCTOR PROPERTIES

BACKGROUND OF THE INVENTION

1. Field of the Invention

This invention relates to optoelectronic devices, especially solar cells, and is more particularly directed to such devices containing a new and improved silicon component having semiconductor properties, and methods for making the silicon.

2. Description of the Prior Art

When producing optoelectronic components, in particular solar cells consisting of silicon, one endeavours to use silicon which is as inexpensive as possible. It is known that the efficiency factor of the cells, the ratio of the overall irradiation energy per surface unit to the solar energy which is usable in photo-voltaic fashion per surface unit then becomes accordingly lower.

At present, an efficiency factor of 15–18% is expected in monocrystalline silicon a factor of 8–10% in poly-crystalline silicon (in extreme cases involving large mono-crystalline zones even up to 12%), and a factor of 1–3% in amorphous silicon.

SUMMARY OF THE INVENTION

An object of the present invention is to provide a method and means to substantially improve the efficiency factor, in particular in poly-crystalline silicon. The invention can also be advantageously used in amorphous and even mono-crystalline silicon and is not limited to poly-crystalline silicon.

With the foregoing and other objects in view, there is provided in accordance with the invention a process for the production of silicon having semiconductor properties with improved optoelectronic properties, which comprises adding an agent to the silicon which increases the carrier life time.

In accordance with the foregoing, there is provided an optoelectronic device containing a silicon component having semiconductor properties, said silicon having incorporated an agent which increases the carrier life time.

There is provided in accordance with the invention a method for increasing the efficiency of an optoelectronic device containing a silicon component having semiconductor properties, which comprises incorporating in silicon to be used as said silicon component, an agent which increases the carrier life time.

Other features which are considered as characteristic for the invention are set forth in the appended claims.

Although the invention is illustrated and described herein as embodied in a method for manufacturing silicon with semiconductor properties, it is nevertheless not intended to be limited to the details shown, since various modifications may be made therein without departing from the spirit of the invention and within the scope and range of equivalents of the claims.

The invention, however, together with additional objects and advantages thereof will be best understood from the following description.

DETAILED DESCRIPTION OF THE INVENTION

The invention is based on the realization that the efficiency factor of optoelectronic semiconductor components runs parallel with the carrier life time of the material and that the carrier life time is reduced by powers of ten as a result of high recombination rates at interstitial positions of the silicon, at the surfaces and at the pn-junctions of the semiconductor body, and in poly-crystalline silicon even at the grain boundaries of the silicon.

The objective on which the invention is based therefore leads to the problem which has not been solved as yet, namely to reduce the recombination rate.

The process for the production of silicon having semiconductor properties therefore provides in accordance with the invention that an agent which increases the carrier life time is added to the extremely pure silicon. Preferably, this agent is added to the poly-crystalline silicon during its production. Expediently, the poly-crystalline silicon is obtained by means of thermal decomposition of a gaseous silicon compound, preferably silico-chloroform ($SiHCl_3$) or silicon tetrachloride ($SiCl_4$), which is mixed with carrier gas, such as hydrogen. The silicon is deposited onto a carrier body, preferably consisting of silicon, which is heated by direct passage of current.

Lead is used as the agent which increases the carrier life time. Therefore, during the deposition of the poly-silicon from the gas phase lead is added in order to increase the carrier life time. The lead is preferably added to the reaction gas in the form of lead iodide ($PbI_2$), lead chloride ($PbCl_2$), lead tetraethyl ($Pb(C_2H_5)_4$) or lead tetramethyl ($Pb(CH_3)_4$). The lead compound can be added in a separate gas stream. However, it is likewise possible to charge the reaction gas mixture with the lead compound used and to adjust the quantity of the lead to be added in a simple fashion by selecting the temperature of the lead compound, i.e., increasing or decreasing the temperature of the lead compound.

The atomic hydrogen which reduces the carrier life time can be increasingly found at interstitial positions, grain boundaries, surfaces and pn-junctions, and it is necessary to concentrate these hydrogen radicals to form innocuous molecular hydrogen. Lead causes the atomic hydrogen to react in the cooling phase of the silicon and thus to precipitate, preferably diffusing into the atmosphere.

Although the inserted lead remains in the silicon it has no detrimental effects. Lead itself has no effect which influences the p- and n-conductivity; consequently it possesses no dopant properties.

The quantity of added lead is $10^{-6}$ to $10^{-9}$, preferably $10^{-7}$ to $10^{-8}$ parts by weight of the silicon. However, limits with respect to excessive lead additions are to be expected where lamellae consisting of metallic lead, coherent layers of lead or small lead metal points form. In particular, it is necessary to avoid them on the inner surfaces of the poly-silicon.

Among the lead compounds which are suitable for common decomposition with the silicon compound, a substance, such as lead tetraethyl ($Pb(C_2H_5)_4$) which is liquid at room temperature, has the advantage of a high vapor pressure. A high vapor pressure implies a simple insertion into silicon and thus a simpler outlay in terms of equipment.

Intake into the reaction gas mixture is possible without heating in the case of tetraethyl lead because it is a liquid. Tetramethyl lead ($Pb(CH_3)_4$) can likewise be used without additional heating.

Solid bodies, such as lead iodide ($PbI_2$) having a melting point at 412° C. and lead chloride ($PbCl_2$) having a melting point at 498° C. are also suitable as a lead addition.

The lead can be supplied to the reaction gas in a subsidiary stream, for example through a separate gas stream. In terms of apparatus it is easier to accommodate lead in the main gas stream. The hydrogen as carrier gas is mixed with a silicon compound, for example silicon chloroform or silicon tetrachloride, and the mixture subsequently charged with lead iodide or another lead compound.

Lead iodide and lead chloride may be accommodated in containers in order to let the reaction gas circulate around them. Even the extent of the incorporation of lead in silicon can be controlled with the aid of the temperature to which the lead compound is brought. More lead can be incorporated when the temperatures are increased.

A reduction in the recombination rate in the silicon is also achieved in that an agent which increases the carrier life, preferably lead, is diffused into the extremely pure silicon. The lead can either be diffused in metallic form or from one of the compounds which are specified in detail in the above. However, lead halides are less suitable as lead compounds because in addition they display depletion phenomena.

In the diffusion process in accordance with the invention, lead can be diffused into a preferably poly-crystalline silicon rod as a whole in a sealed container. Likewise, a mono-crystalline or amorphous silicon rod can be divided into disks and lead diffused into the disk stack in an ampoule which is completely sealed.

To the silicon rod may be gaseous lead, which is either vaporized or originates from a gaseous compound, during the noncrucible zone melting. However, the evaporation rate of lead has to be considered here. In any event, lead incorporation of a magnitude of $10^{-8}$ parts by weight can be achieved during the zone melting.

The reaction container is heated to approximately 1250° C. for the diffusion and the lead is diffused in the course of several hours, for example in the course of three days.

A dopant, preferably phosphorus, which determines the conductivity of the silicon can be diffused together with the lead diffusion. A lead addition within the limits of $10^{-6}$ to $10^{-9}$, preferably $10^{-7}$ to $10^{-8}$, parts by weight of silicon can be achieved by means of a process in accordance with the present invention.

In the so-called ampulla using lead, 0.5 mg. of metallic lead was used for 500 g of silicon disks. The hermetically sealed and evacuated ampoule was then heated to 1250° C. and the lead was diffused for 24 hours. However, equally good results could also be obtained with the aid of 1 mg of lead acetate for 500 g of silicon disks, with the ampoule likewise heated to 1250° C. for 24 hours.

There are claimed:

1. Process for production of poly-crystalline silicon having semiconductor properties with improved optoelectronic properties, which comprises forming the poly-crystalline silicon by thermal decomposition of a reaction mixture of a gaseous silicon compound selected from the group consisting of silicon chloroform and silicon tetrachloride mixed with a carrier gas containing hydrogen, depositing said poly-crystalline silicon onto a silicon carrier body which is heated by means of direct passage of electric current, and adding lead to the poly-crystalline silicon during its production, as an agent which increases the carrier life time.

2. Process according to claim 1, wherein said lead is supplied as a compound carried by a separate gas stream.

3. Process according to claim 1, wherein lead is supplied by charging a reaction mixture of gaseous silicon compound and carrier gas with a lead compound.

4. Process according to claim 2 or claim 3, wherein the quantity of the lead to be incorporated is varied by varying the temperature of the lead compound.

5. Process according to claim 1, wherein the amount of lead addition is $10^{-6}$ to $10^{-9}$ parts by weight of silicon.

6. Process according to claim 1, wherein the amount of lead addition is $10^{-7}$ to $10^{-8}$ parts by weight of silicon.

7. Process according to claim 1, wherein metallic lead is used for the lead incorporation.

8. Process according to claim 1, wherein lead iodide is used for the lead incorporation.

9. Process according to claim 1, wherein lead chloride is used for the lead incorporation.

10. Process according to claim 1, wherein lead tetraethyl is used for the lead incorporation.

11. Process according to claim 1, wherein lead tetramethyl is used for the lead incorporation.

12. Process according to claim 1, wherein lead acetate is used for the lead incorporation.

13. Process for production of poly-crystalline silicon having semiconductor properties with improved optoelectronic properties, which comprises forming the poly-crystalline silicon by thermal decomposition of a reaction mixture of a gaseous silicon compound selected from the group consisting of silicon chloroform and silicon tetrachloride mixed with a carrier gas containing hydrogen, depositing said poly-crystalline silicon onto a silicon carrier body which is heated by means of direct passage of electric current, and thereafter diffusing lead into the poly-crystalline silicon.

14. Process according to claim 13, wherein the lead is diffused into a poly-crystalline silicon rod in a sealed container.

15. Process according to claim 13, wherein a silicon rod is divided into disks and a stack of disks is diffused with lead in a sealed ampoule.

16. Process according to claim 13, wherein the lead is diffused into the semiconductor material at a temperature of approximately 1250° C.

17. Process according to claim 13, wherein a dopant which determines the conductivity of the silicon is diffused simultaneously with the lead diffusion.

18. Process according to claim 17, wherein said dopant diffusion is a phosphorous diffusion.

19. Process according to claim 13 or claim 17, wherein the lead diffusion is carried out over a period of at least several hours.

20. Process for the production of poly-crystalline silicon having semiconductor properties with improved optoelectric properties, which comprises forming the poly-crystalline silicon by thermal decomposition of a reaction mixture of a gaseous silicon compound selected from the group consisting of silicon chloroform and silicon tetrachloride mixed with a carrier gas containing hydrogen, depositing said poly-crystalline silicon into a silicon carrier body which is heated by means of direct passage of electric current to form a poly-crystalline silicon rod, subjecting said silicon rod to crucible-free zone melting, and doping said rod with gaseous lead during the crucible-free zone melting.

21. Process according to claim 20, wherein said lead is supplied as a gaseous lead compound.

22. A method for increasing the efficiency of an optoelectronic device containing a silicon component having semiconductor properties, which comprises incorporating in silicon to be used as said silicon component, lead as an agent which increases the carrier life time wherein the amount of lead addition is $10^{-6}$ to $10^{-9}$ parts by weight of silicon.

23. Method according to claim 22, wherein the amount of lead is $10^{-7}$ to $10^{-8}$ parts by weight of silicon.

24. A method of increasing the efficiency of a solar cell containing a silicon component having semiconductor properties, which comprises incorporating in silicon to be used as said silicon component, lead as an agent which increases the carrier life time to effect an increase in the efficiency factor of the cell wherein the amount of lead addition is $10^{-6}$ to $10^{-9}$ parts by weight of silicon.

25. Method according to claim 24, wherein the amount of lead is $10^{-7}$ to $10^{-8}$ parts by weight of silicon.

26. An optoelectronic device containing a silicon component having semiconductor properties, said silicon having incorporated lead as an agent which increases the carrier life time.

27. Optoelectronic device according to claim 26, wherein the amount of lead addition is $10^{-6}$ to $10^{-9}$ parts by weight of silicon.

28. Optoelectronic device according to claim 27, wherein the lead addition is $10^{-7}$ to $10^{-8}$ parts by weight of silicon.

29. A solar cell containing a silicon component having semiconductor properties, said silicon having lead as an agent which increases the carrier life time to effect an increase in the efficiency factor of the cell.

30. Solar cell according to claim 29, wherein the amount of lead addition is $10^{-6}$ to $10^{-9}$ parts by weight of silicon.

31. Solar cell according to claim 30, wherein the lead addition is $10^{-7}$ to $10^{-8}$ parts by weight of silicon.

* * * * *